United States Patent [19]

Kekas et al.

[11] 4,268,100
[45] May 19, 1981

[54] PIVOTALLY MOUNTED PRINTED CIRCUIT BOARD HOLDER

[75] Inventors: Dennis H. Kekas; Ronald P. McAdams; Alexander Polischuk-Sawtschenko, all of Raleigh, N.C.

[73] Assignee: International Business Machines Corporation, Armonk, N.Y.

[21] Appl. No.: 1,102

[22] Filed: Jan. 5, 1979

[51] Int. Cl.³ .............................................. H05K 7/16
[52] U.S. Cl. ............................ 339/17 LM; 361/391; 361/415
[58] Field of Search ....... 339/17 M, 17 LM, 176 MP, 339/34; 361/391, 412, 413, 415; 211/41

[56] References Cited

U.S. PATENT DOCUMENTS

| | | | |
|---|---|---|---|
| 3,315,128 | 4/1967 | Raymond | 361/391 |
| 3,683,238 | 8/1972 | Olds et al. | 361/413 |
| 3,798,507 | 3/1974 | Damon et al. | 361/415 |
| 4,155,109 | 3/1979 | Finch et al. | 361/413 |

Primary Examiner—Neil Abrams
Attorney, Agent, or Firm—Gerald R. Woods

[57] ABSTRACT

A printed circuit board holder includes an integral, generally rectangular board receptacle which is pivotally supported above the base of a data processing device by spaced cradle posts. The receptacle can be pivoted from a normal position through an angle of approximately 90° to a service position in which the receptacle bottom wall is nearly perpendicular to the base. An integral latch mechanism keeps the holder in the normal position until the latch is manually released. Multiple pin connector boards and stiffener plates are secured to the receptacle by integral latches.

9 Claims, 6 Drawing Figures

PIVOTALLY MOUNTED PRINTED CIRCUIT BOARD HOLDER

TECHNICAL FIELD

The present invention relates to data processing devices and more particularly to an improved, pivotally mounted printed circuit board holder for use in such devices.

PRIOR ART

Data processing devices normally employ printed circuit boards to physically support and electrically connect discrete components and integrated circuit chips which perform necessary electronic functions. Depending upon the complexity of a particular device, one to several dozen printed circuit boards may be required.

Many different types of printed circuit board holders have been developed. While the details of the holder designs vary, all known holders possess certain common attributes. Available holders are made from a number of discrete parts which are assembled and fastened by adhesives or conventional screw-type fasteners. After the holders are assembled, they are usually secured permanently to a frame or wall member of the data processing device in which they are to be used.

Known board holders present a number of problems. Since they are made of discrete parts, manufacture of the holders is necessarily preceded by manufacture, shipment and storage of the individual parts. All of these separate operations take time. The time spent on the initial separate operations represents a cost which must be factored into the cost of the final product.

Assembly of a holder from a number of discrete parts is also a time consuming operation which often requires special tools. The required assembly time and the need for assembly tools, whether special or not, can significantly increase the cost of the finished holder.

Another drawback to known printed circuit board holders is that it is not easy to service boards which are mounted in such holders. A customer engineer may find it desirable to test a printed circuit board by applying test signals to the board through the board contacts. At present, a printed circuit board must be removed from the holder to permit this type of diagnostic operation. It may be inconvenient and time consuming for the customer engineer to remove a board for testing. Moreover, device malfunctions are sometimes the result of contact degradation at the multiple pin connector boards which provide an electrical interface between the printed circuit boards and cable connectors leading to keyboards, displays and the like. When a printed circuit board is removed from the holder for testing, the tests necessarily ignore possible problems at the interface between the printed circuit board and the multiple pin connector boards which are attached to the holder.

SUMMARY

These and other problems are overcome by a printed circuit board holder which includes first and second support members extending upwardly from the base of an electronic data processing device. A generally rectangular receptacle having opposed end walls, opposed side walls and a bottom wall is supported by the first and second support members for pivotal movement about an axis between the members. The receptacle can be pivoted from a normal position, in which its bottom wall is parallel to the base of the data processing device, to a service position, in which the bottom wall of the receptacle is approximately perpendicular to the base of the data processing device. When the receptacle is in the service position, a customer engineer can remove the cable normally coupled to a particular card to exercise or test that card while it is still in the holder.

BRIEF DESCRIPTION OF THE DRAWINGS

While the specification concludes with claims particularly pointing and distinctly claiming that which is regarded as the present invention, details of a preferred embodiment of the invention may be more readily ascertained from the following detailed description when read in conjunction with the accompanying drawings wherein:

DETAILED DESCRIPTION

Figure 1:
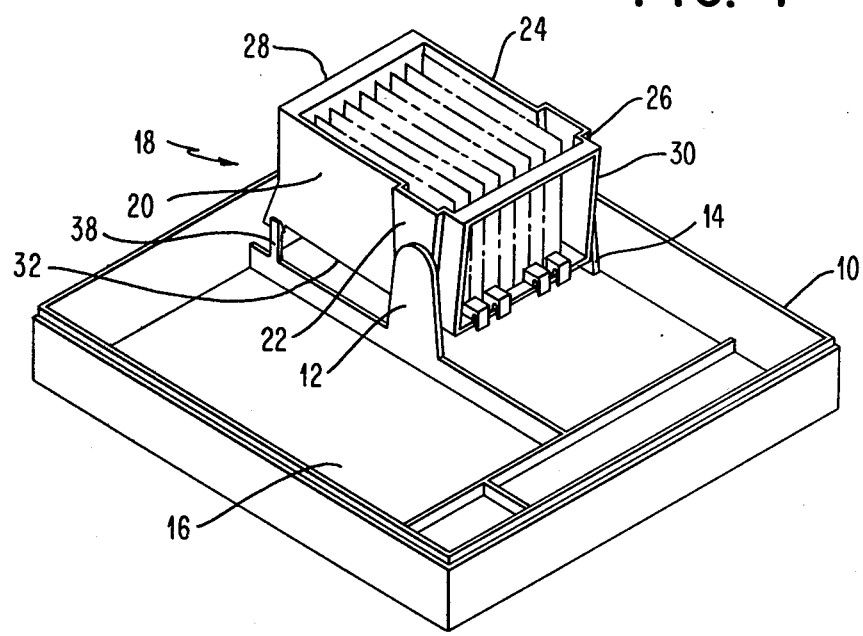
FIG. 1 is a perspective view of a printed circuit board holder constructed in accordance with the present invention in the base portion of a data processing device.

FIG. 1 shows a printed circuit board holder constructed in accordance with the present invention as a component part of a data processing device having a base section 10. Since the present invention may be used with many different types of data processing devices, the base section 10 is shown only generally.

The holder includes a pair of spaced support members or cradle posts 12 and 14 extending upwardly from a floor 16 of the base section 10. The posts 12 and 14 support a generally rectangular receptacle 18. The receptacle 18 includes a first side wall 20 having an outwardly recessed panel 22 and a second side wall 24 having a similar recessed panel 26. As will be explained in more detail later, the recessed panels 22 and 26 have openings therethrough for receiving studs on the inside surfaces of the posts 12 and 14. The studs and side wall openings define an axis about which the receptacle 18 may be pivoted. The receptacle 18 further includes a first end wall 28 and a second end wall 30.

Figure 2:
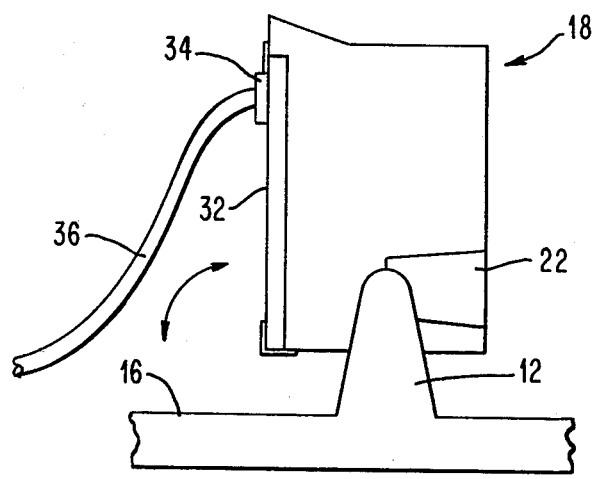
FIG. 2 is an elevational view with the printed circuit board holder pivoted to a service position.

Printed circuit boards are located into the receptacle 18 in side-by-side manner through the open top with the contact-bearing edges of the printed circuit boards being adjacent bottom wall 32 of receptacle 18. Referring to FIG. 2, each printed circuit board is connected to a terminating connector for a multiple wire cable. While only one connector 34 and cable 36 are shown to simplify the drawing, there would actually be a number of such cables. The cables transmit signals between the printed circuit boards and other components of the terminal, such as keyboards, displays and the like.

Referring again to FIG. 1, the receptacle 18 is shown in its normal or operating position with the bottom wall 32 parallel to the floor 16 of the base section 10. The receptacle 18 is retained in this position by a receptacle latch, only one guidepost 38 for which is visible in FIG. 1. A more detailed description of the remaining components of the latch is provided below. Referring now to FIG. 2, it is possible to pivot the receptacle 18 through an angle of approximately 90° to a service position in which the bottom wall 32 is substantially perpendicular to the floor 16. When the receptacle 18 has been pivoted to this position, any cable can be manually removed to allow a customer engineer to apply test signals to a printed circuit board within the holder through the holder contact structure. Stop ribs (not shown) on the inside surfaces of the support posts 12 and 14 are contacted by the raised edges of the recessed panels 22 and 26 to prevent movement of the receptacle beyond the service position.

Figure 3:
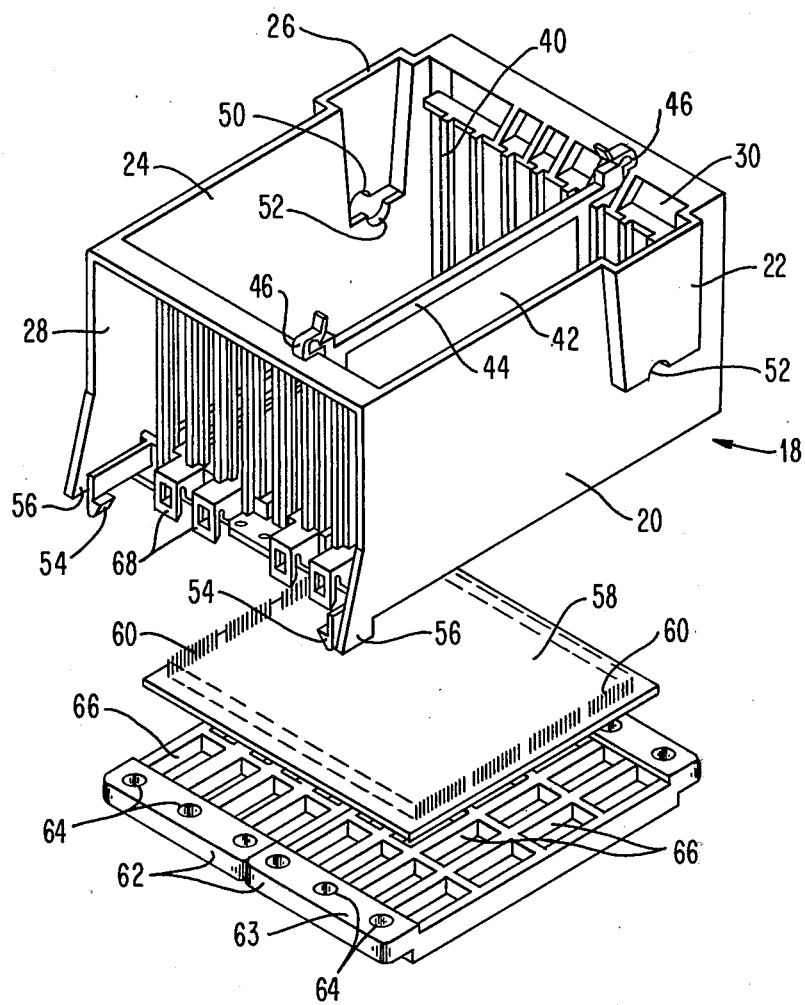
FIG. 3 is a perspective view showing the printed circuit board receptacle, a connector or pin board and a stiffener plate for holding the pin board in position.

The detailed construction of the receptacle 18 can be seen more clearly in FIG. 3. The receptacle is preferably a one-piece molded structure having vertical guides 40 in the end walls 28 and 30 for receiving printed circuit boards, such as board 42. The boards are preferably mounted in frames, such as frame 44. A particularly useful type of frame 44 includes camming members 46 pivotally attached to the frame at opposite ends. When the board 42 is inserted into the receptacle by aligning it in one of the vertical guides 40 and applying pressure at the midpoint of the frame 44, the camming members 46 are forced up and in as they contact the upper edges of the end walls 28 and 30. To remove the board from the receptacle, the camming members 46 are forced outward and downward manually against the upper edges of the walls to lift the board above the level of other boards in the receptacle. The frame 44 can then be more readily gripped to lift the board clear of the receptacle.

In the earlier description, it was indicated that side walls 20 and 24 had openings therethrough at the recessed panels 22 and 26. Each opening actually consists of a first semicircular indentation 50 at the lower edge of a recessed panel and a second oppositely-oriented semi-circular indentation 52 in the side wall material at the lower edge of the recess defined by one of the panels 22 or 26. Each pair of indentations 50 and 52, taken together, form a circular opening for receiving a short inwardly-extending stud on one of the support posts 12 and 14. The panels 22 and 26 serve the functions of receiving the studs without having the studs project substantially past the inner surface of a side wall, of providing clearance between the support posts and the major portions of the side wall surface, and of providing the extending shoulder or edge which restricts movement of the receptacle beyond the service position.

The receptacle 18 also includes a pair of latching arms 54 which are part of the latch used to hold the receptacle 18 in its normal position. Further details of the receptacle latch are provided later. Each of the latching arms 54 is adjacent a small projection or ear 56 at the corner of the side wall 20 and 24. As will also be explained in more detail later, the projections 56 are used to support the receptacle 18 in its normal position.

Electrical connections between the printed circuit boards in the receptacle 18 are provided through one or more pin boards having conductive pins extending through insulating boards. A single pin board 58 is illustrated in FIG. 3 with only a few conductive pins 60 being shown. In practice, a half sized board could be provided if the receptacle 18 were to carry half or less of its maximum board capacity. Any pin board which is provided will include arrays of pins over its entire surface with the pin spacing being equal to the contact spacing at the edges of the printed circuit boards carried within receptacle 18. The pin board 58 is retained and rigidified by one or more molded stiffener plates 62, each of which includes plate-locating openings 64 in end flanges 63 and a grid work of integral cross pieces forming a number of connector-receiving openings 66. The stiffener plates 62 are retained by sets of bendable latching arms 68 located at the lower edges of the end walls 28 and 30.

Figure 4:
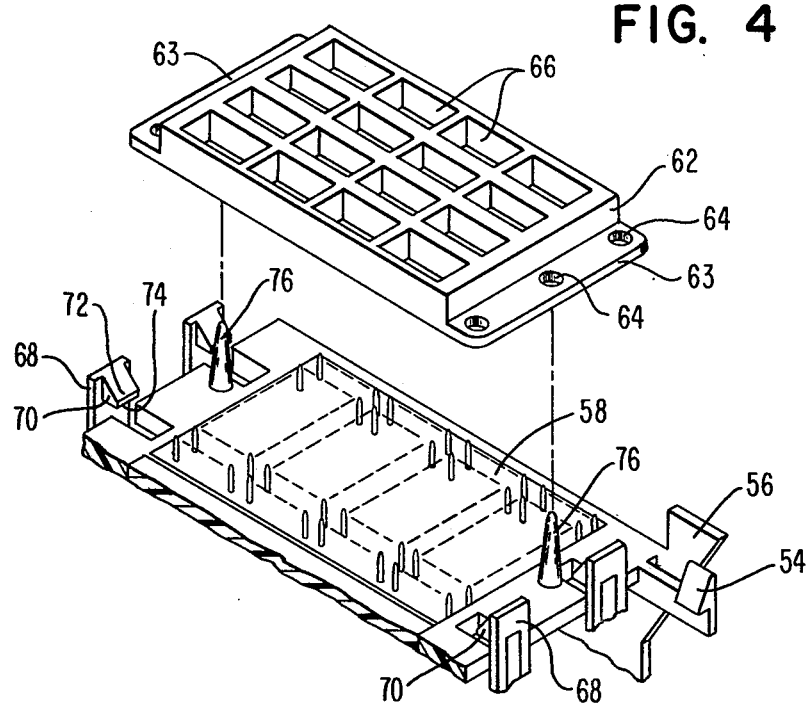
FIG. 4 is a perspective view of an inverted receptacle showing additional details for the locating and latching components for the pin board and stiffener plate.

As can be seen more clearly in FIG. 4, each of the latching arms 68 includes an inwardly extending projection 70 with an outer surface 72 which slants toward the center of the receptacle 18 and an inner surface 74 which is substantially parallel to the bottom wall of the receptacle.

Locating pins (not shown) on pin board 58 are guided into openings in the bottom wall structure of receptacle 18 to initially position pin board 58 during assembly of the holder. When the pin board 58 is in place, stiffener plate 62 is aligned by means of tapered pins 76 protruding from the bottom wall of the receptacle 18. While only one tapered pin 76 is provided at each end of the receptacle 18, each stiffener plate 62 has several openings 64 in flanges 63, permitting the stiffener plate to be mounted into several different positions relative to the bottom wall of receptacle 18. The slanted outer surfaces 72 of the latching arms 68 act as camming surfaces which force the latching arms 68 outward as the stiffener plate 62 is forced toward the receptacle. When flanges 63 on the stiffener plates clear the projections 70, the resiliency of the latching arm material causes each latching arm to return to its normal position, in which inner surfaces 74 contact or at least overlie the flanges 63. If necessary, the stiffener plate 62 can be removed by manually forcing the latching arms 68 away from each other before lifting the plate 62 from the tapered pins 76.

Figure 5:
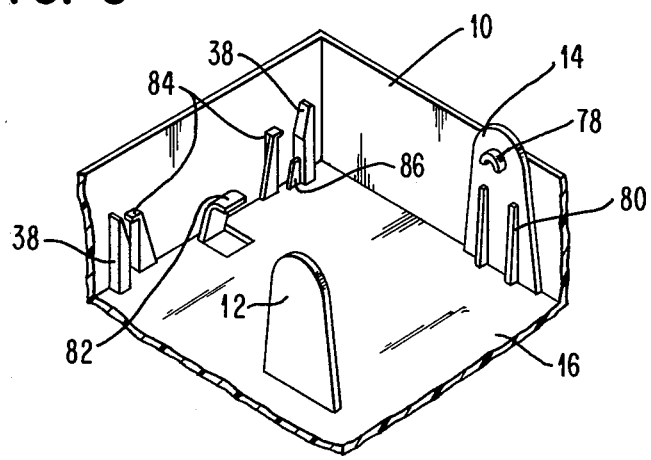
FIG. 5 is a perspective view of the data processing device base with the receptacle removed to show additional details as to the support member structure and receptacle latching means.

FIG. 5 shows those portions of the holder which are preferably integral with the base of the data processing device into which the holder is incorporated. The inwardly extending stud 78 on support post 14 may be a C-shaped member integral with the support post. A similar stud (not shown) extends inwardly from support post 12. The C-shaped structure of the stud facilitates assembly of receptacle 18 to the support posts while still allowing the receptacle 18 to pivot smoothly about the axis defined by the inwardly extending studs. Each of the posts 12 and 14 includes a stop rib 80 which contacts the edge of one of the panels 22 and 26 to limit the travel of the receptacle 18 when it is pivoted to its service position. In the service position, the weight of the receptacle is borne by the stop ribs and the studs on the support posts 12 and 14.

The receptacle latch includes a leaf spring 82 extending upwardly from the floor 16 of the base section 10. Leaf spring 82, which is preferably integral with the base section 10, provides an upward biasing force on the bottom wall of the receptacle 18 when the receptacle is in its normal position. The leaf spring 82 forces latching arms on receptacle 18 into engagement with latching posts 84 extending upwardly from the floor 16 of base section 10. The latching post 84 are flanked by vertical guide posts 38, each of which has a stop rib 86 adjacent its lower end.

Figure 6:
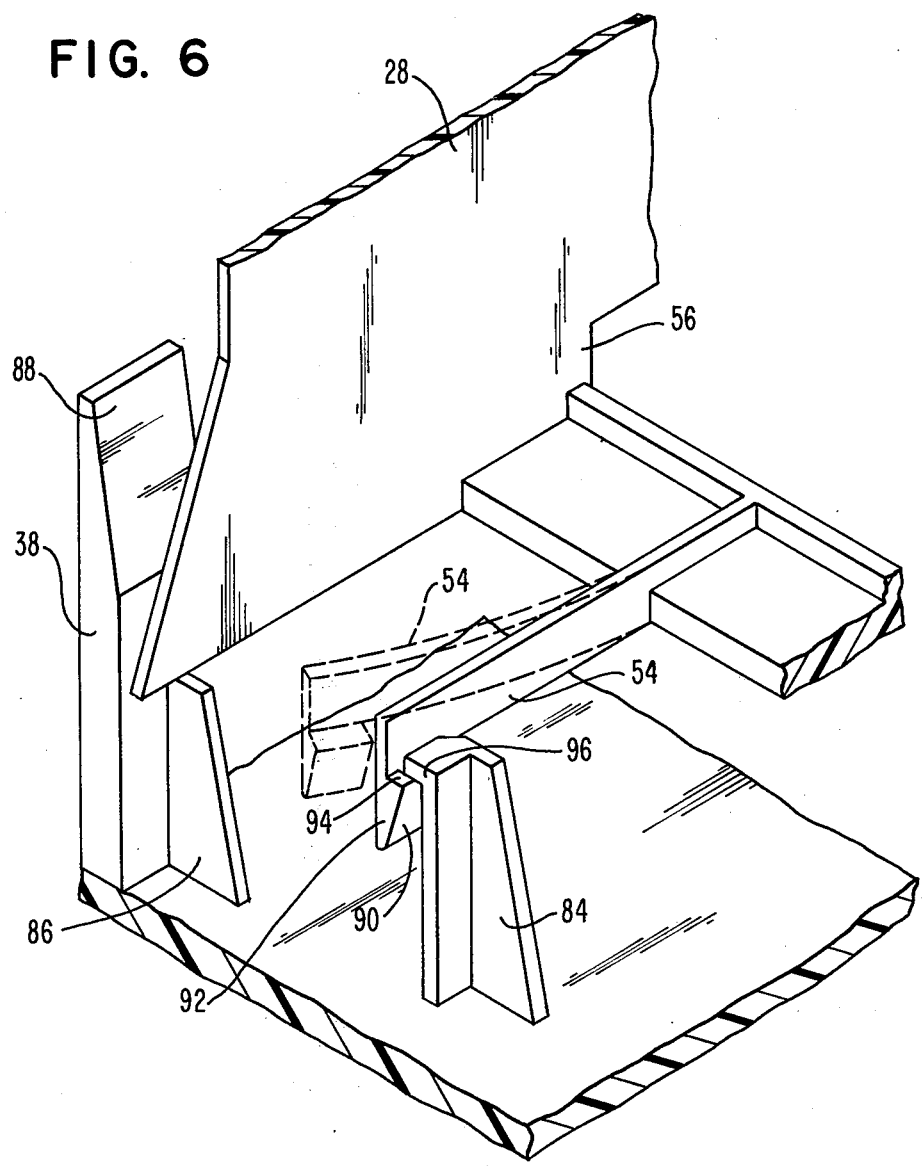
FIG. 6 is an enlarged perspective view of the receptacle latching means used to hold the receptacle in its normal position.

The details of the receptacle latch are shown more clearly in FIG. 6, which is a greatly enlarged view of one corner of the receptacle 18 in its normal, latched position.

When the receptacle 18 is first secured to the support posts 12 and 14 or when it is being returned from its service position, the receptacle is guided towards it normal position by guide posts 38, each of which has a tapered tip 88. Referring specifically to FIG. 6, the projection 56 on side wall 28 moves downward in contact with the tapered tip 88 toward the stop rib 86. During this downward movement, a tapered surface 90 on a shoulder 92 of latching arm 54 causes the latching arm 54 to be cammed to one side as it slides past the upper end of the latching post 84. At a certain point in the downward movement of the receptacle, a flat upper surface 94 on shoulder 92 will clear the underside of a projection 96 on latching post 84. The natural resiliency of the latching arm 54 will cause the latching arm to return to a position in which shoulder 92 and projection 96 are vertically aligned. The receptacle 18 is biased upwardly by the leaf spring 82 to provide positive contact between the mating surfaces of the latching arm 54 and the latching post 84. The receptacle is released from this latched or normal position by forcing the latching arms 54 away from their corresponding latching post. The release position of the latching arm 54 shown in dotted outline in FIG. 6.

While there has been described what is considered to be a preferred embodiment of the present invention, variations and modifications may occur to those skilled in the art once they become acquainted with the basic concepts of the invention. Therefore, it is intended that the appended claims shall be construed to include the preferred embodiment and all variations and modifications that fall within the true spirit and scope of the invention.

Having thus described my invention, what I claim as new, and desire to secure by Letters Patent is:

1. For use in an electronic data processing device having a base, a holder for printed circuit boards comprising:
   first and second support members extending upwardly from the base, each of said support members having a stop member and an inwardly extending stud, said studs being aligned along a common axis;
   a generally rectangular receptacle having opposed end walls, opposed side walls and a bottom wall, each of said sidewalls further including a recessed panel parallel to but displaced outwardly from the remainder of the side wall and having an opening therein for receiving one of the inwardly extending studs on the support members, said receptacle being pivotable from a normal position in which the bottom wall is approximately parallel to but spaced above the base to a service position delimited by the stop members on said support members, the bottom wall being approximately perpendicular to the base in the service position; and
   latching means for releasably holding said receptacle in the normal position.

2. A holder as defined in claim 1 wherein each of the side wall openings is defined by a first semicircular indentation in the lower edge of the recessed panel and a second, oppositely-oriented semicircular indentation in the side wall at the lower edge of the recess, said indentations forming a circular opening for receiving the stud on the associated support member without allowing the stud to extend inwardly substantially beyond the inner surface of the receptacle side wall.

3. A holder as defined in claim 2 wherein said receptacle is an integral, molded structure.

4. A holder as defined in claim 3 in further combination with:
   multiple pin connector boards for providing an electrical interface between printed circuit boards carried by said holder and cable-terminating connectors associated with the data processing device; and
   means for retaining said connector boards at the bottom wall of said receptacle.

5. A holder as defined in claim 4 wherein said retaining means comprises:
   at least one stiffener plate having openings therethrough for the pins on said multiple pin connector boards; and
   latching means for securing each said stiffener plate to said receptacle at the bottom wall thereof, said latching means comprising a plurality of bendable latching arms, each extending beyond the bottom wall of said receptacle at the periphery thereof and each having an inwardly-extending shoulder parallel to the bottom wall.

6. A holder as defined in claim 4 wherein said holder latching means comprises:
   at least one latching post extending upward from the device base, each said latching post having a shoulder extending parallel to the base;
   at least one latching arm extending outward from the bottom wall of said receptacle, each said latching arm bearing against the underside of a latching post projection in an unbiased state to prevent upward pivotal movement of the receptacle, each said arm and post being relatively movable to release the receptacle from the latched condition.

7. For use in an electronic data processing device having a base, a holder for printed circuit boards comprising:
   first and second support members extending upwardly from the base, each of said support members having a stop member;
   a generally rectangular receptacle having opposed end walls, opposed side walls and a bottom wall, said receptacle being supported by said support members for pivotal movement about an axis between said members from a normal position in which the bottom wall is approximately parallel to but spaced above the base to a service position in which the bottom wall is approximately perpendicular to the base, said receptacle being prevented from movement beyond the service position by said stop members;
   latching means for releasably holding said receptacle in the normal position;
   multiple pin connector boards for providing an electrical interface between printed circuit boards carried by said holder and cable-terminating connectors associated with the data processing device; and
   means for retaining the connector boards at the bottom wall of said receptacle, said retaining means further comprising
   at least one stiffener plate having openings therethrough for the pins on said multiple pin connector boards, and latching means for securing each said stiffener plate to said receptacle at the bottom wall thereof, said latching means comprising a plurality of bendable latching arms, each extending beyond the bottom wall of said receptacle at the periphery thereof and each having an inwardly-extending shoulder parallel to the bottom wall.

8. A holder as defined in claim 7 wherein said holder latching means comprises:

at least one latching post extending upward from the device base, each said latching post having a shoulder extending parallel to the base;

at least one latching arm extending outward from the bottom wall of said receptacle, each said latching arm bearing against the underside of a latching post projection in an unbiased state to prevent upward pivotal movement of the receptacle, each said arm and post being relatively movable to release the receptacle from the latched condition.

9. A holder as defined in claim 8 wherein each said holder latching arm and each said stiffener latching arm is integral with the receptacle from which it extends and said side walls, said end walls and said bottom wall are part of an integral structure.

* * * * *